(12) United States Patent
Pan et al.

(10) Patent No.: US 11,513,571 B2
(45) Date of Patent: Nov. 29, 2022

(54) REVERSIBLE AIRFLOW SHROUD

(71) Applicant: Dell Products L.P., Round Rock, TX (US)

(72) Inventors: Ming-Hui Pan, Zhongshan Dist. (TW); Cho Shih Huai, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/224,810

(22) Filed: Apr. 7, 2021

(65) Prior Publication Data
US 2022/0326744 A1 Oct. 13, 2022

(51) Int. Cl.
*G06F 1/20* (2006.01)
*H05K 7/20* (2006.01)

(52) U.S. Cl.
CPC ........... *G06F 1/20* (2013.01); *H05K 7/20145* (2013.01)

(58) Field of Classification Search
CPC ... G06F 1/20; H05K 7/20145; H05K 7/20572
See application file for complete search history.

(56) References Cited

U.S. PATENT DOCUMENTS

| | | | | |
|---|---|---|---|---|
| 7,474,528 B1* | 1/2009 | Olesiewicz | ........ | H05K 7/20154 361/695 |
| 11,314,297 B1* | 4/2022 | Degner | ................. | G06F 1/1656 |
| 11,330,740 B2* | 5/2022 | Bryan | ..................... | G06F 1/206 |
| 2005/0241810 A1* | 11/2005 | Malone | ................. | F04D 25/166 165/122 |
| 2008/0117589 A1* | 5/2008 | Carrera | ..................... | G06F 1/20 165/59 |
| 2010/0265662 A1* | 10/2010 | Tracy | ..................... | G06F 1/203 361/714 |
| 2011/0081851 A1* | 4/2011 | Franz | ................. | H05K 7/20145 137/1 |
| 2011/0128704 A1* | 6/2011 | Chang | ................. | H05K 7/20727 361/697 |
| 2011/0184568 A1* | 7/2011 | Tai | ..................... | G05D 23/1934 700/282 |
| 2011/0235272 A1* | 9/2011 | Bash | ................. | H05K 7/20727 361/692 |
| 2012/0020013 A1* | 1/2012 | Li | ............................. | G06F 1/20 138/46 |
| 2013/0242504 A1* | 9/2013 | Cartes | ................ | H05K 7/20836 361/691 |
| 2016/0174413 A1* | 6/2016 | Steinbrecher | ...... | H05K 7/20727 361/679.51 |

(Continued)

*Primary Examiner* — Stephen S Sul
*Assistant Examiner* — Alexander Ryan Horton
(74) *Attorney, Agent, or Firm* — Jackson Walker L.L.P.

(57) ABSTRACT

An information handling system may include a chassis having a first region and a second region, wherein the first region includes a memory module, and wherein the second region includes a processing unit; at least one air mover configured to provide airflow; and an airflow shroud including an airflow baffle. When the airflow shroud is installed in the information handling system in a first orientation, the airflow baffle may be configured to block at least a portion of the airflow from flowing through the first region. When the airflow shroud is installed in the information handling system in a second orientation, the airflow baffle may be configured to block at least a portion of the airflow from flowing through the second region.

15 Claims, 6 Drawing Sheets

(56) References Cited

U.S. PATENT DOCUMENTS

| | | | |
|---|---|---|---|
| 2016/0215999 A1* | 7/2016 | Bard | H05K 7/20736 |
| 2020/0072257 A1* | 3/2020 | Liang | F24F 13/082 |
| 2020/0363844 A1* | 11/2020 | Sun | G06F 1/20 |
| 2020/0383243 A1* | 12/2020 | Kulkarni | H05K 7/1489 |
| 2021/0100130 A1* | 4/2021 | Fanning | H05K 7/20127 |
| 2021/0274684 A1* | 9/2021 | Ni | F28F 13/06 |
| 2021/0278885 A1* | 9/2021 | Sabotta | F28D 15/0241 |
| 2021/0349508 A1* | 11/2021 | Chang | H05K 7/2039 |

\* cited by examiner

REVERSIBLE AIRFLOW SHROUD

TECHNICAL FIELD

The present disclosure relates in general to information handling systems, and more particularly to shrouds and baffles for directing airflow within information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In many information handling systems, the central processing unit (CPU) is no longer the only processor dissipating significant power. For example, with the rise of AI technology, many systems also include one or more special-purpose processing units such as GPUs.

The total system airflow rate may be limited by air mover technology, vibration/acoustic limitations, and other considerations. Accordingly, optimizing and balancing the available airflow to cool high-power components such as CPUs and GPUs is increasingly important.

Airflow shrouds and baffles are sometimes used to deal with airflow pattern optimization. Typically, however, different system configurations need different types of airflow shrouds to allocate suitable airflow rates for CPUs, GPUs, and other components such as memory modules, respectively. For example, a system configured for general use may employ a shroud that directs more airflow to the memory modules (referred to herein as "general mode"), and a system configured for AI training and the like may employ a shroud that directs more airflow to the GPUs (referred to herein as "GPU mode").

These different shrouds are constructed differently and are not interchangeable. It would thus be advantageous to be able to use a single part to satisfy the requirements of different system configurations.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with airflow shrouds may be reduced or eliminated.

In accordance with embodiments of the present disclosure, an information handling system may include a chassis having a first region and a second region, wherein the first region includes a memory module, and wherein the second region includes a processing unit; at least one air mover configured to provide airflow; and an airflow shroud including an airflow baffle. When the airflow shroud is installed in the information handling system in a first orientation, the airflow baffle may be configured to block at least a portion of the airflow from flowing through the first region. When the airflow shroud is installed in the information handling system in a second orientation, the airflow baffle may be configured to block at least a portion of the airflow from flowing through the second region.

In accordance with these and other embodiments of the present disclosure, a method may include installing an airflow shroud including an airflow baffle in an information handling system, wherein the information handling system includes at least one air mover configured to provide airflow, and a chassis having a first region and a second region, wherein the first region includes a memory module, and wherein the second region includes a processing unit; wherein, when the airflow shroud is installed in the information handling system in a first orientation, the airflow baffle is configured to block at least a portion of the airflow from flowing through the first region; and wherein, when the airflow shroud is installed in the information handling system in a second orientation, the airflow baffle is configured to block at least a portion of the airflow from flowing through the second region.

In accordance with these and other embodiments of the present disclosure, an airflow shroud apparatus may include an airflow baffle. The airflow shroud apparatus may be installable in an information handling system that includes at least one air mover configured to provide airflow, and a chassis having a first region and a second region, wherein the first region includes a memory module, and wherein the second region includes a processing unit. When the airflow shroud apparatus is installed in the information handling system in a first orientation, the airflow baffle may be configured to block at least a portion of the airflow from flowing through the first region. When the airflow shroud apparatus is installed in the information handling system in a second orientation, the airflow baffle may be configured to block at least a portion of the airflow from flowing through the second region.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6B, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

Figure 1:
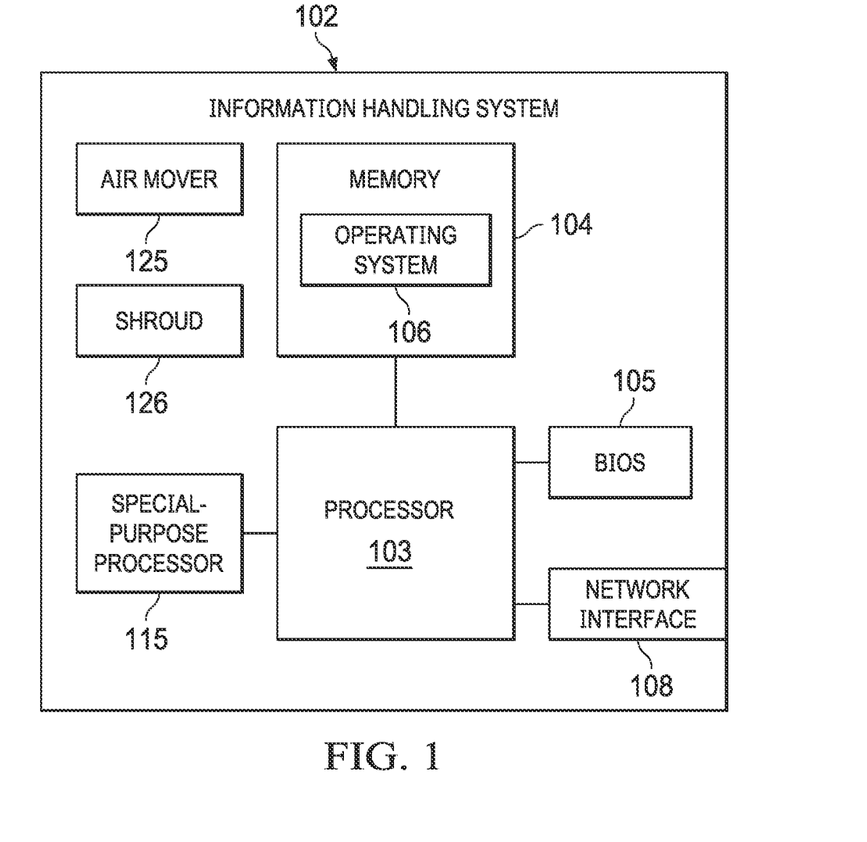
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Information handling system 102 may further include one or more special-purpose processors 115. In some embodiments, special-purpose processor 115 may be a graphics processing unit (GPU).

Information handling system 102 may further include one or more air movers 125 for providing cooling to information handling system 102 and/or components thereof. Air movers 125 may include fans, blowers, or any other suitable device for creating airflow. Air movers 125 may be configured to draw cool air into a chassis of information handling system 102, exhaust hot air from a chassis of information handling system 102, and/or move air within a chassis of information handling system 102. In some embodiments, air mover 125 may be electronically controllable via processor 103 and/or software executing thereon. For example, a speed of air mover 125 may be controllable via a pulse width modulation (PWM) signal.

Information handling system 102 may further include one or more shrouds 126. Shroud 126 may be configured to direct airflow (e.g., from air mover 125) toward processor 103, toward special-purpose processor 115, etc. In particular, as discussed in further detail herein, shroud 126 may be "reversible" in that it may be installed in different orientations to accommodate different airflow objectives.

Figure 2A:
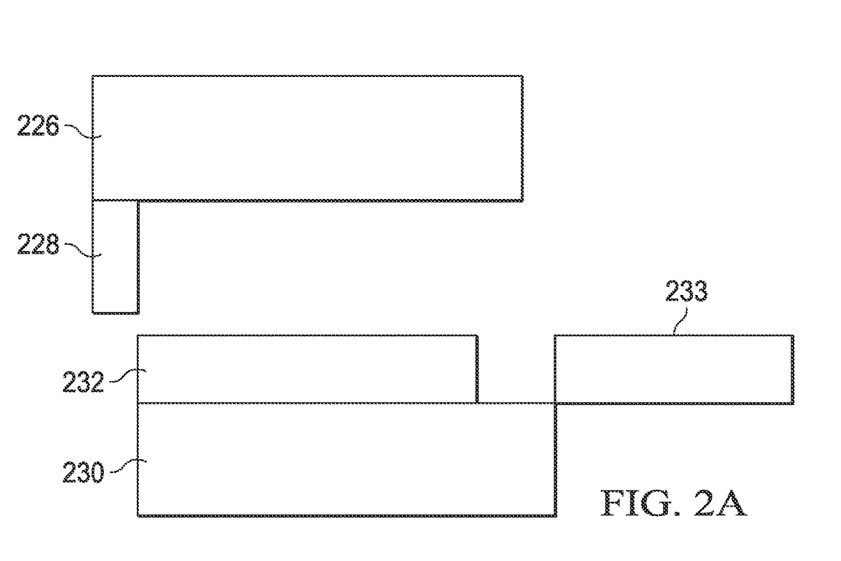
FIGS. 2A-2C illustrate a side view of an airflow shroud and baffle being installed on a system in a GPU mode, in accordance with embodiments of the present disclosure.
Figure 2B:
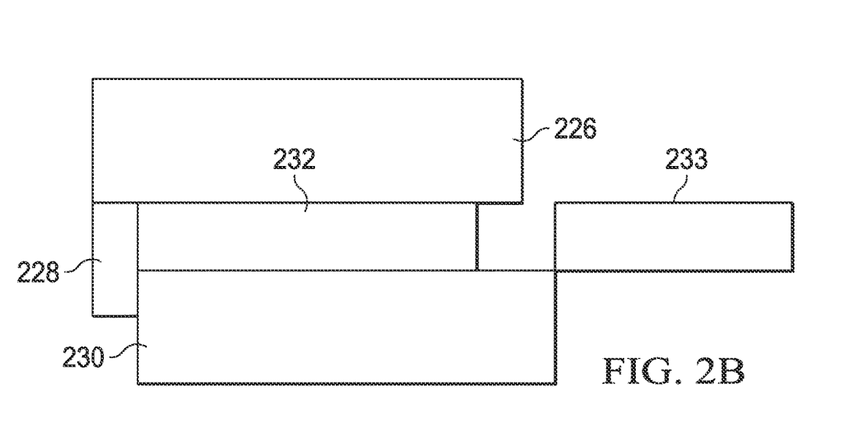
Figure 2C:
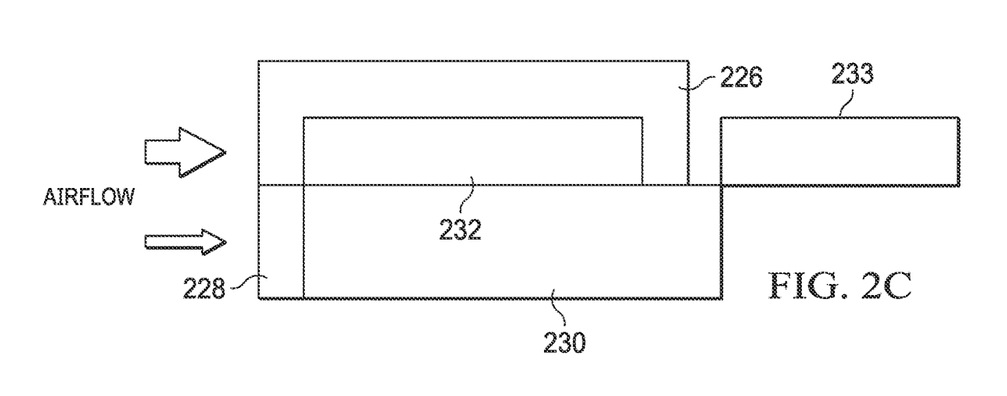

Turning now to FIGS. 2A-2C, side views are shown of a shroud 226 which includes a movable baffle 228 being installed in an information handling system. The information handling system includes a memory module 230, a CPU module 232, and a GPU module 233. In this example, the information handling system is configured for GPU mode.

As shown in FIGS. 2A-2C, as shroud 226 is lowered into position, baffle 228 obstructs airflow to memory module 230. (In some embodiments, baffle 228 may include airflow vents therein, such that the obstruction is only partial. For example, baffle 228 may include approximately 50% of its area as vents, with the other 50% as obstructions.)

Shroud 226 may be constructed as a shell that may be installed such that CPU module 232 and/or GPU module 233 may reside (partially or entirely) inside shroud 226. Shroud 226 may provide little or no airflow restriction to CPU module 232 and GPU module 233 in this configuration. Thus as shown in FIG. 2C, a large amount of airflow may pass across CPU module 232 and GPU module 233, while a smaller amount may pass across memory module 230.

Figure 3A:
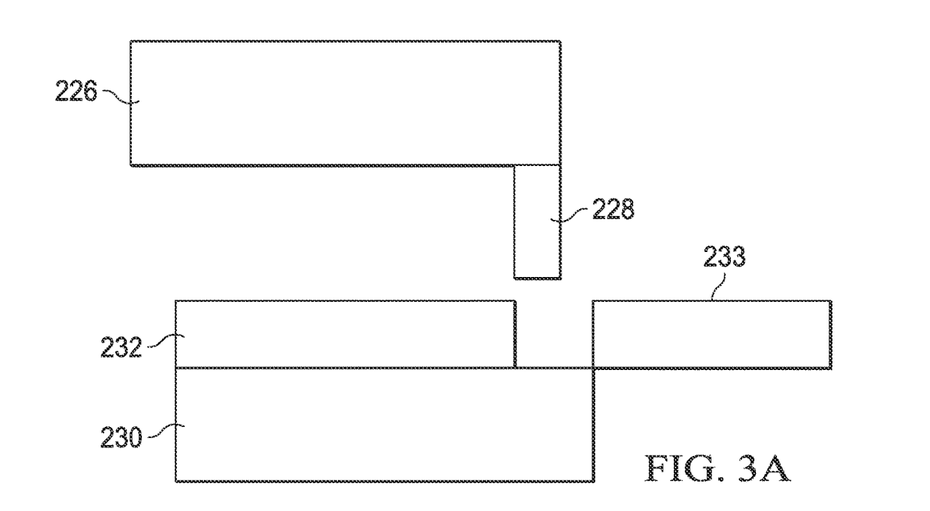
FIGS. 3A-3C illustrate a side view of an airflow shroud and baffle being installed on a system in a general mode, in accordance with embodiments of the present disclosure.
Figure 3B:
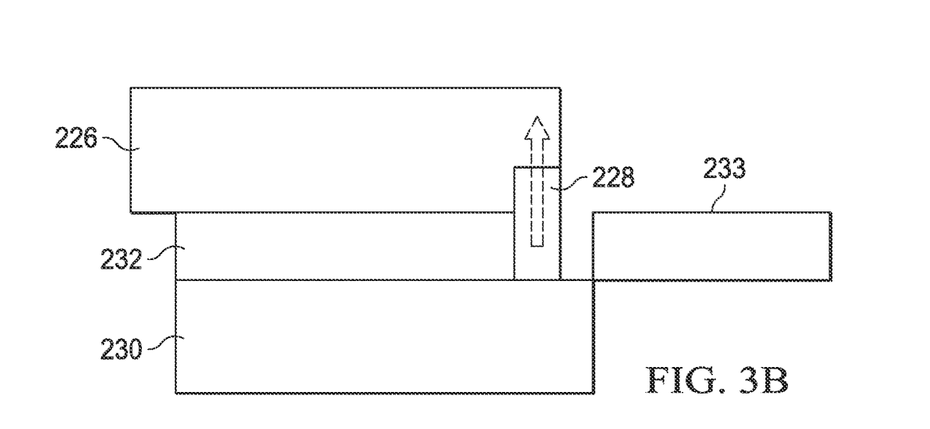
Figure 3C:
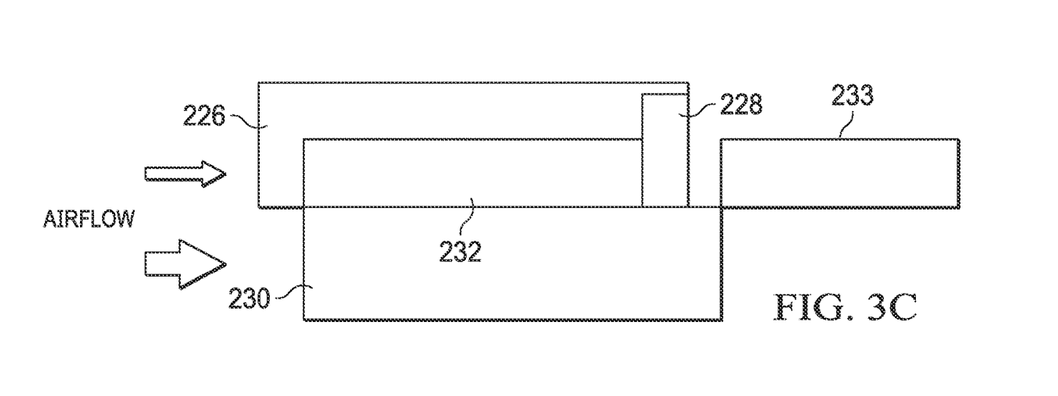

Turning now to FIGS. 3A-3C, similar views are shown of installing the same shroud 226 in a reversed orientation in an information handling system that is configured for general mode. For example, relative to the situation of FIGS. 2A-2C, shroud 226 may be rotated 180 degrees about its central vertical axis.

As shown in FIGS. 3A-3C, as shroud 226 is lowered into position, baffle 228 may come into contact with a component of memory module 230. For example, baffle 228 may come into contact with a structural member of the chassis of the information handling system, memory components (e.g., DIMMs), a circuit board, or any other suitable portion of memory module 230. This interference may cause baffle 228 to translate vertically relative to shroud 226. For example, baffle 228 may be mounted on rails on or in shroud 226, and it may be translatable along such rails.

Accordingly, in this configuration, shroud 226 and baffle 228 may obstruct airflow to GPU module 233. Shroud 226 may provide little or no airflow restriction to memory module 230 in this configuration. Thus as shown in FIG. 3C, a large amount of airflow may pass across memory module 230, while a smaller amount may pass across GPU module 233.

Figure 4A:
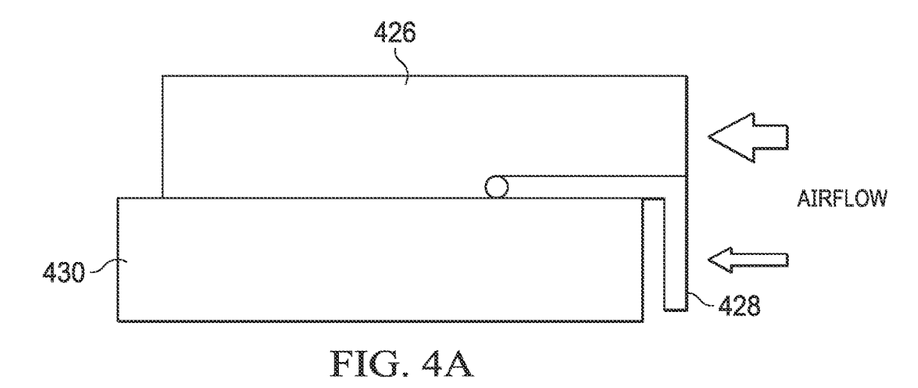
FIGS. 4A and 4B illustrate side views of another airflow shroud and baffle, in accordance with embodiments of the present disclosure.
Figure 4B:
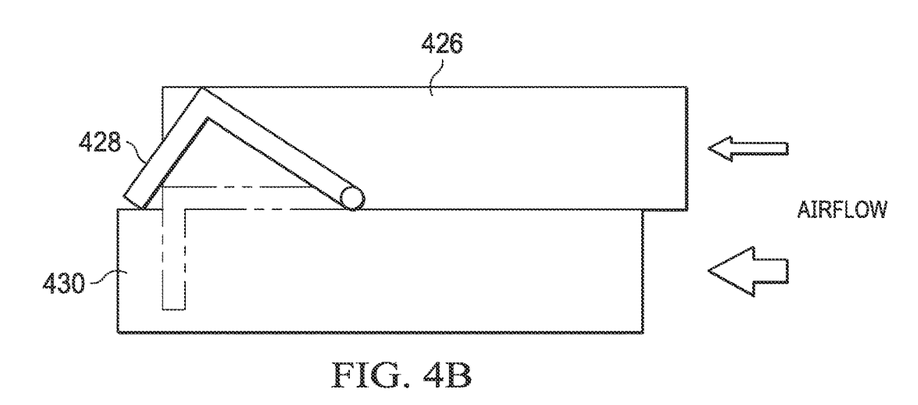
Figure 4C:
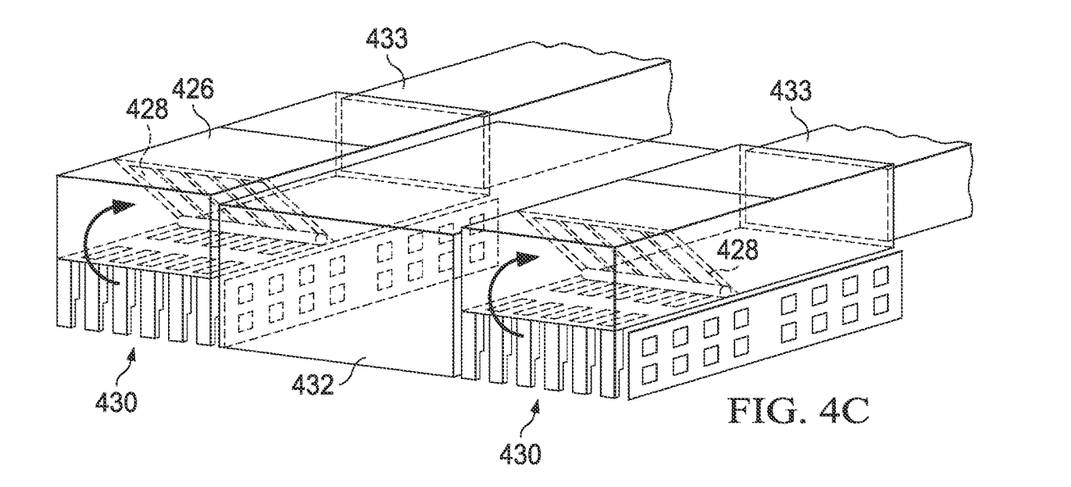
FIG. 4C illustrates an isometric view of the embodiment of FIG. 4B, in accordance with embodiments of the present disclosure.

Turning now to FIGS. 4A-4C, an alternative embodiment is shown in which shroud 426 and baffle 428 are installed in an information handling system. In FIG. 4A, the information handling system is configured for a GPU mode, such that baffle 428 blocks all or a portion of the airflow from passing across memory module 430. Accordingly, baffle 428 causes additional airflow to pass over the GPU module within shroud 426 (not shown in this view).

In FIG. 4B, a similar view is shown of installing the same shroud 426 in a reversed orientation in an information handling system that is configured for general mode. For example, relative to the situation of FIG. 4A, shroud 426 may be rotated 180 degrees about its central vertical axis.

Accordingly, as shroud 426 is lowered into position, baffle 428 may come into contact with a component of memory module 430. This interference may cause baffle 428 to rotate about an axis relative to shroud 426. For example, baffle 428 may be mounted on a pin or axle on or in shroud 226, and it may be rotatable about that axis.

Accordingly, in this configuration, shroud 426 and baffle 428 may obstruct airflow to the GPU module that is disposed within shroud 426. Shroud 426 may provide little or no airflow restriction to memory module 430 in this configuration. Thus as shown in FIG. 4B, a large amount of airflow may pass across memory module 430, while a smaller amount may pass across the GPU module.

FIG. 4C shows an isometric view of the embodiment of FIG. 4B. For the sake of clarity, the portion of baffle 428 that comes into contact with memory module 430 is omitted in this view.

In the view of FIG. 4C, two separate memory modules 430 are shown, with CPU module 432 disposed between them. Two GPU modules 433 are disposed laterally offset from and above memory modules 430.

Figure 5A:
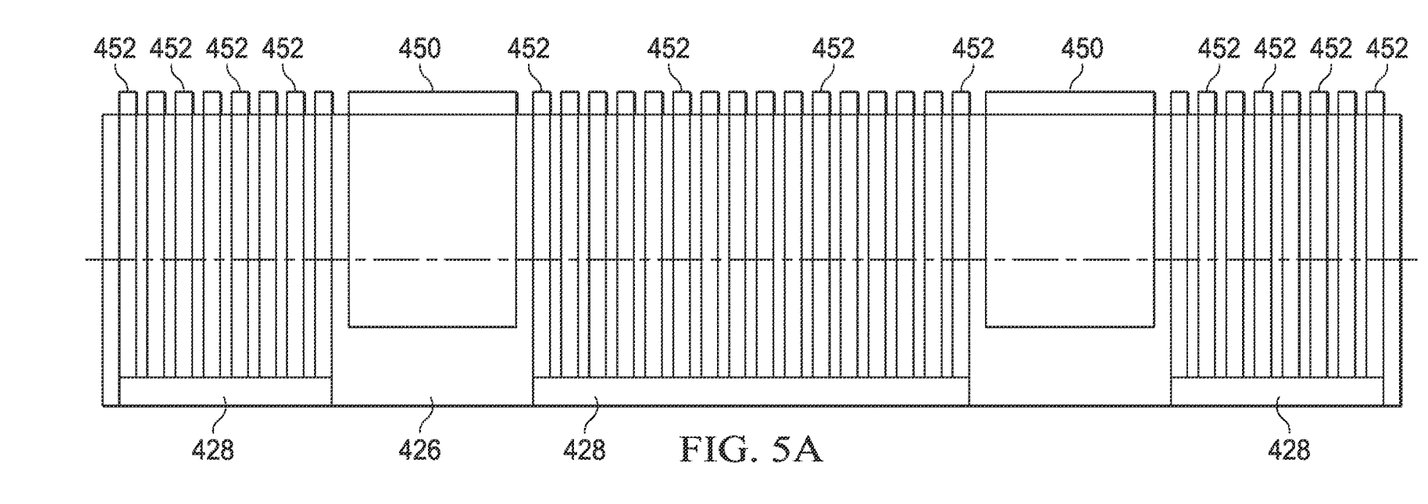
FIG. 5A illustrates a top view of an airflow shroud and baffle installed on a system in a GPU mode, in accordance with embodiments of the present disclosure.
Figure 5B:
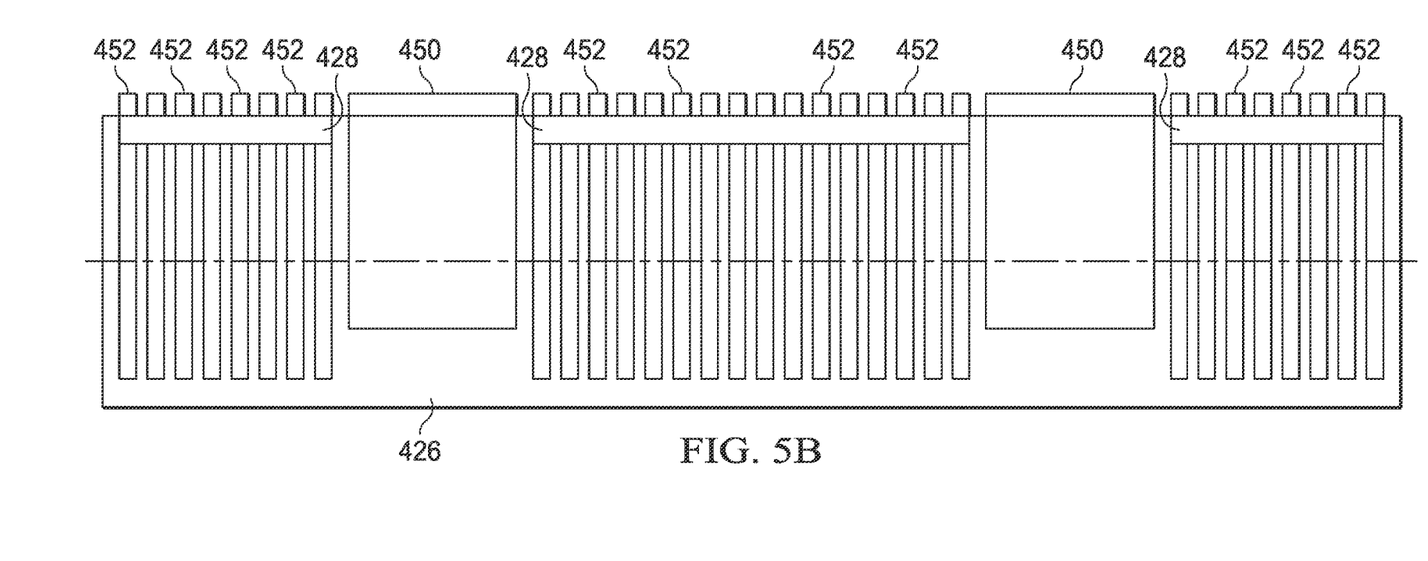
FIG. 5B illustrates a top view of an airflow shroud and baffle installed on a system in a general mode, in accordance with embodiments of the present disclosure.

Turning now to FIGS. 5A and 5B, top views are shown of a similar embodiment. As shown in FIGS. 5A and 5B, baffle 428 is divided into three portions. In FIG. 5A, the information handling system is in a GPU mode. Baffles 428 are in the down position, similar to the view shown in FIG. 4A. Baffles 428 may block airflow to memory modules (e.g., DIMMs) 452. In this embodiment, baffles 428 are not positioned to block airflow to CPUs 450 or the GPU module.

FIG. 5B shows the corresponding view of the same information handling system configured for a general mode.

As shown, shroud 426 has been reversed, and baffles 428 are lifted upward by memory modules 452.

Figure 6A:
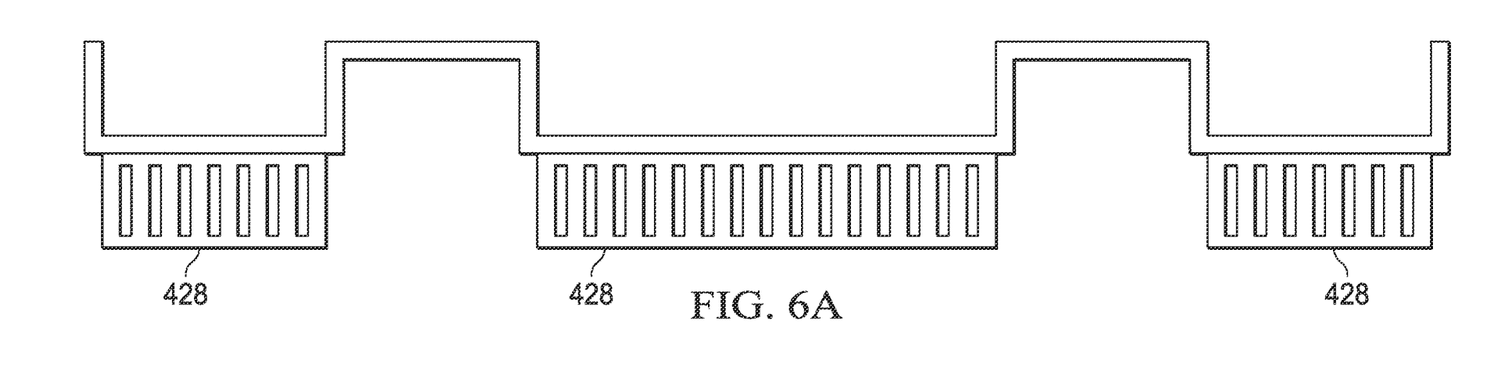
FIG. 6A illustrates a front view of an airflow shroud and baffle installed on a system in a GPU mode, in accordance with embodiments of the present disclosure.
Figure 6B:
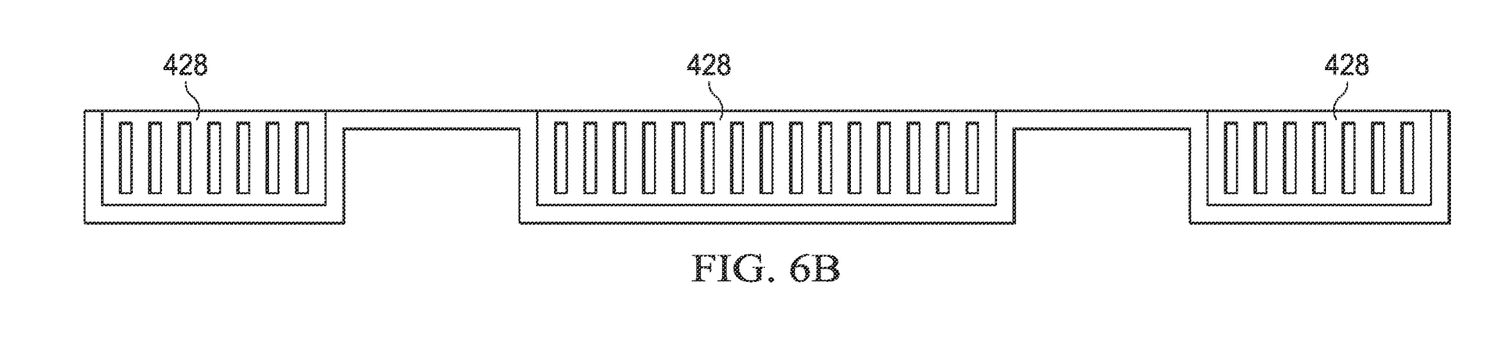
FIG. 6B illustrates a front view of an airflow shroud and baffle installed on a system in a general mode, in accordance with embodiments of the present disclosure.

FIGS. 6A and 6B show front views of the embodiments of FIGS. 5A and 5B, respectively. As is visible in these views, baffles 428 may include airflow holes or slots to allow a desired portion of the airflow to pass through them. Accordingly, baffles 428 need not block 100% of the airflow, but may in some embodiments block only a desired amount.

Accordingly, embodiments of this disclosure may provide many benefits. For example, the ability to have one type of shroud that is usable in multiple configurations may save costs in terms of tooling as well as unit costs. The complexity of producing, stocking, and shipping additional parts may also be lessened. Further, the flexibility to switch configurations easily may provide benefits to end-users.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Unless otherwise specifically noted, articles depicted in the drawings are not necessarily drawn to scale. However, in some embodiments, articles depicted in the drawings may be to scale.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
    a chassis having a first region and a second region, wherein the first region includes a memory module, and wherein the second region includes a processing unit;
    at least one air mover configured to provide airflow; and
    an airflow shroud including an airflow baffle;
    wherein, when the airflow shroud is installed in the information handling system in a first orientation, the airflow baffle is configured to block at least a portion of the airflow from flowing through the first region;
    wherein, when the airflow shroud is installed in the information handling system in a second orientation, the airflow baffle is configured to block at least a portion of the airflow from flowing through the second region; and
    wherein, when the airflow shroud is moved from the first orientation to the second orientation, the airflow baffle is configured to rotate relative to the airflow shroud.

2. The information handling system of claim 1, wherein the processing unit is a graphics processing unit (GPU).

3. The information handling system of claim 1, wherein the airflow baffle includes apertures configured to allow a portion of the airflow to pass through the airflow baffle.

4. The information handling system of claim 1, wherein the second orientation is obtained by rotating the airflow shroud 180 degrees relative to the first orientation.

5. The information handling system of claim 4, wherein the rotating comprises rotating about a central vertical axis of the airflow shroud.

6. A method comprising:
    installing an airflow shroud including an airflow baffle in an information handling system, wherein the information handling system includes at least one air mover configured to provide airflow, and a chassis having a first region and a second region, wherein the first region includes a memory module, and wherein the second region includes a processing unit;
    wherein, when the airflow shroud is installed in the information handling system in a first orientation, the airflow baffle is configured to block at least a portion of the airflow from flowing through the first region;
    wherein, when the airflow shroud is installed in the information handling system in a second orientation, the airflow baffle is configured to block at least a portion of the airflow from flowing through the second region; and
    wherein, when the airflow shroud is moved from the first orientation to the second orientation, the airflow baffle is configured to rotate relative to the airflow shroud.

7. The method of claim 6, wherein the airflow shroud including the airflow baffle includes a plurality of airflow baffles.

8. The method of claim 6, wherein the processing unit is a graphics processing unit (GPU).

9. The method of claim 6, wherein the airflow baffle includes apertures configured to allow a portion of the airflow to pass through the airflow baffle.

10. An airflow shroud apparatus comprising:
    an airflow baffle;
    wherein the airflow shroud apparatus is installable in an information handling system that includes at least one air mover configured to provide airflow, and a chassis having a first region and a second region, wherein the first region includes a memory module, and wherein the second region includes a processing unit;
    wherein, when the airflow shroud apparatus is installed in the information handling system in a first orientation, the airflow baffle is configured to block at least a portion of the airflow from flowing through the first region;

wherein, when the airflow shroud apparatus is installed in the information handling system in a second orientation, the airflow baffle is configured to block at least a portion of the airflow from flowing through the second region; and wherein, when the airflow shroud apparatus is moved from the first orientation to the second orientation, the airflow baffle is configured to translate linearly relative to the airflow shroud apparatus.

11. The airflow shroud apparatus of claim 10, wherein the processing unit is a graphics processing unit (GPU).

12. The airflow shroud apparatus of claim 10, wherein the airflow baffle includes apertures configured to allow a portion of the airflow to pass through the airflow baffle.

13. The airflow shroud apparatus of claim 10, wherein the linearly translating includes sliding along at least one rail.

14. The airflow shroud apparatus of claim 10, wherein the second orientation is obtained by rotating the airflow shroud apparatus 180 degrees relative to the first orientation.

15. The airflow shroud apparatus of claim 14, wherein the rotating comprises rotating about a central vertical axis of the airflow shroud apparatus.

\* \* \* \* \*